(12) United States Patent
Takahara et al.

(10) Patent No.: US 8,182,610 B2
(45) Date of Patent: May 22, 2012

(54) CLEANING EQUIPMENT AND CLEANING METHOD OF DEPOSITION MASK

(75) Inventors: Yoichi Takahara, Tokyo (JP); Fumio Kataoka, Kamisato (JP); Kenji Yumiba, Kamisato (JP); Kenji Katagiri, Kamisato (JP); Ryo Izaki, Nakai (JP)

(73) Assignee: Hitachi High-Technologies Corporation, Tokyo (JP)

( * ) Notice: Subject to any disclaimer, the term of this patent is extended or adjusted under 35 U.S.C. 154(b) by 406 days.

(21) Appl. No.: 12/551,821

(22) Filed: Sep. 1, 2009

(65) Prior Publication Data

US 2010/0101601 A1   Apr. 29, 2010

(30) Foreign Application Priority Data

Oct. 29, 2008  (JP) .................................. 2008-278289

(51) Int. Cl.
*B08B 5/04* (2006.01)
(52) U.S. Cl. ................. 134/1.2; 134/1; 134/10; 134/21; 134/24; 134/42
(58) Field of Classification Search ............... 134/1, 1.2, 134/10, 21, 24, 42
See application file for complete search history.

(56) References Cited

FOREIGN PATENT DOCUMENTS

| JP | 11-033442 | 2/1999 |
|---|---|---|
| JP | 2002-241925 | 8/2002 |
| JP | 2004-192850 | 7/2004 |
| JP | 2006-169573 | 6/2006 |
| JP | 2006-192426 | 7/2006 |
| JP | 2010236088 | * 10/2010 |

* cited by examiner

*Primary Examiner* — Bibi Carrillo
(74) *Attorney, Agent, or Firm* — Antonelli, Terry, Stout & Kraus, LLP.

(57) ABSTRACT

Equipment is realized which is capable of increasing the frequency of use of a deposition mask of an organic EL element and the recycle of an adhesive agent by efficiently cleaning the deposition mask with little damage and efficiently collecting the adhesive agent. A pulse laser is irradiated to a deposition mask to separate the deposition agent from the deposition mask. The separated deposition agent is sucked by a suction nozzle, and the deposition agent is separated from air by a cyclone and deposited on a bottom of the cyclone. Thereafter, a first valve is opened to collect the deposition agent in a deposition agent collection section. Then a second valve is opened to move the deposition agent to a deposition agent refining section to be refined. A third valve is opened to store the refined deposition agent in a deposition agent storage section. The deposition mask may be cleaned without being damaged to collect the deposition agent with high efficiency.

2 Claims, 3 Drawing Sheets

CLEANING EQUIPMENT AND CLEANING METHOD OF DEPOSITION MASK

CLAIM OF PRIORITY

The present application claims priority from Japanese Patent Application JP 2008-278289 filed on Oct. 29, 2008, the content of which is hereby incorporated by reference into this application.

BACKGROUND OF THE INVENTION

1. Field of the Invention

The present invention relates to a device for manufacturing an organic EL element, and more particularly to cleaning equipment and cleaning method of a deposition mask for removing a deposition agent deposited on the deposition mask by laser, and collecting the deposition agent by a cyclone for recycling.

2. Description of the Related Art

Because of the thin and flat screen, the liquid crystal display device, the organic EL display device and the like have been increasingly demanded for the use as the flat display of the monitor and the TV. The organic EL display device with the light emitting feature exhibits an excellent view angle property. As the device needs no backlight, it is expected to be employed as the display in a wide variety of application fields.

The organic EL display device includes an organic EL layer formed of plural light emitting layers and a TFT for driving the organic EL layer to generate pixels arranged in a matrix so as to form a display region. The light emitting organic EL layer is formed in the pixel part through deposition on a planarizing film on the layer where the thin film transistor (TFT) is formed, or on the planarizing film on the layer where the TFT is not formed.

In the mainstream method of manufacturing the organic EL element, the deposition mask is employed for forming the pattern film. The element pattern is formed by heating and sublimating the deposition agent in the chamber so as to be deposited on the substrate through the opening of the deposition mask. The deposition agent is deposited on the portion of the deposition mask other than the opening. So the deposition mask is cleaned in accordance with the frequency for forming the film.

The wet type method employed for cleaning the deposition mask poses such problems as requiring longer processing time, increasing the environmental load owing to the use of the organic solvent, exerting damage to the miniature pattern, and making the collection and recycling of the deposition agent difficult. The dry type method using the laser has been developed to cope with those problems. JP-A No. 2006-192426 discloses the technology for cleaning the deposition mask by irradiating the laser thereto to separate the deposition agent so as to be immersed in ultrapure water and the organic solvent. JP-A No. 2006-169573 discloses the technology for collecting the deposition agent separated from the deposition mask coated with the adhesive film through which the laser has been irradiated to the mask.

The technology disclosed in JP-A No. 2006-192426 employs the laser to separate the deposition agent. However, there is no description with respect to collection of the separated deposition agent. JP-A No. 2006-192426 discloses the technology for immersing the mask in the ultrapure water or the organic solvent after separating the deposition agent from the mask for cleaning. In the disclosed case, it is difficult to collect the deposition agent.

In JP-A No. 2006-169573, the mask is coated with the adhesive film through which the laser is irradiated to the mask to separate the deposition agent therefrom, and the separated deposition agent is collected from the adhesive film. As the deposition agent is adhered to the adhesive portion of the film, the collection rate of the deposition agent is deteriorated. This may also cause the risk of mixing impurities such as the adhesive compound with the collected deposition agent.

The present invention is intended to realize the system structured to irradiate the laser to the mask for separating the deposition agent therefrom, and for collecting the separated deposition agent at a high collection rate while keeping high purity for recycling.

SUMMARY OF THE INVENTION

It is an object of the present invention to provide a device which allows a suction unit to suck the deposition agent separated by the laser and the separation unit to separate and collect the sucked deposition agent for transferring the separated/collected deposition agent to a predetermined deposition chamber so as to be recycled.

Preferably, the pulse laser is used as the laser irradiated to the deposition mask on which the deposition agent is deposited. If the deposition agent is removed by the laser of general type, the deposition agent is altered due to abrasion, which makes it difficult to collect and recycle the deposition agent. The pulse laser is capable of separating the deposition agent without decomposition. The analysis using the IR absorption spectrum shows that the deposition agent separated by the pulse laser is identical to the one deposited on the deposition mask. The use of the pulse laser allows the deposition agent to be recycled without alteration.

The deposition agent separated by the pulse laser is sucked by the suction nozzle such that the deposition agent is not adhered to the deposition mask again. The particle of the deposition agent sucked by the suction nozzle has a large size of more than several μms. This makes it possible to separate the deposition agent from air which is sucked into the cyclone simultaneously with the deposition agent. The separated deposition agent is subjected to the process for removing impurities in the deposition agent refining section, and is further transferred to the deposition agent storage section. It is then fed to the deposition chamber so as to be used for deposition together with the new deposition agent.

The use of the cleaning equipment according to the present invention efficiently removes the deposition agent adhered to the deposition mask so as to be recycled. The removed deposition agent is not adhered to the cleaned deposition mask again. As the deposition mask is hardly damaged in the aforementioned process, the usability of the mask may be considerably improved, thus greatly enhancing the usability of the adhesive agent.

DETAILED DESCRIPTION OF THE INVENTION

The structure of the organic EL display device to which the manufacturing method is applied will be described prior to the specific description of the embodiment. The organic EL display device has two types, that is, a bottom emission type where the light emitted from the organic EL layer is directed to the element substrate side, and a top emission type where the emitted light is directed to the side opposite the element substrate. The top emission type allows the light emitting organic EL layer to be formed on the region on which the TFT is applied, which is advantageous from the aspect of luminance. The top emission type will be described as an example hereinafter. However, the description with respect to the bottom emission type is essentially the same.

Figure 5:
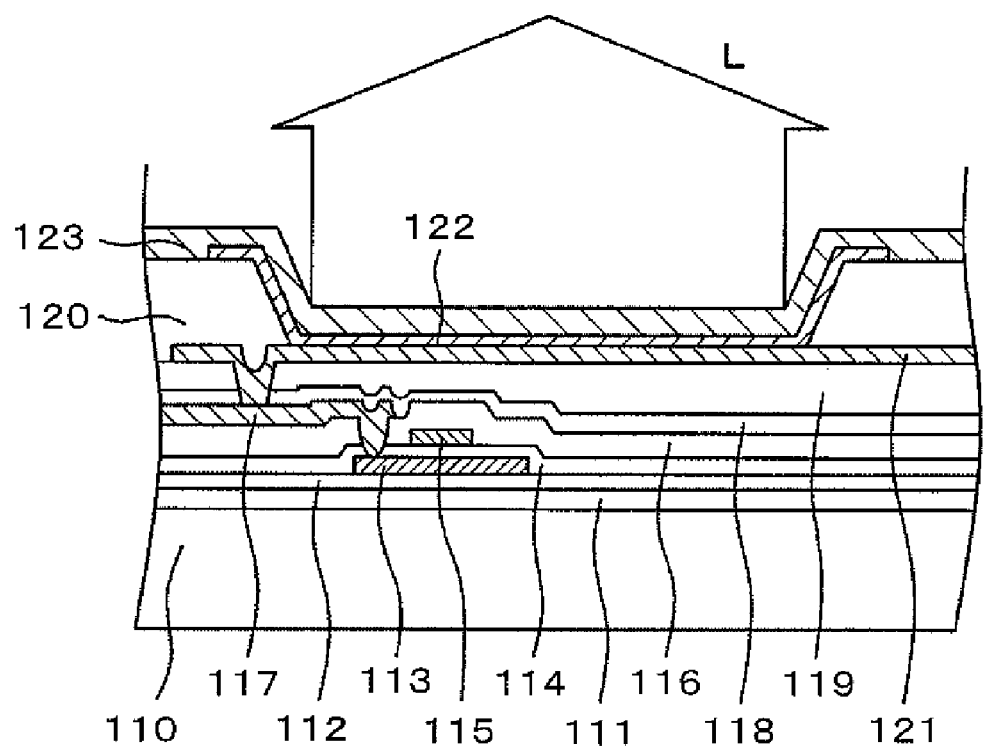
FIG. 5 shows an example of the organic EL display device manufactured by the present invention.

FIG. 5 is a sectional view of the organic EL display device of top emission type. The top emission type includes two types, that is, a top anode type having an anode formed on an organic EL layer 122 and a top cathode type having a cathode formed on the organic EL layer 122. FIG. 5 shows the top anode type. However, the present invention may be applied to the top cathode type as well.

Referring to FIG. 5, a first base film 111 formed of SiN and a second base film 112 formed of $SiO_2$ are laminated on an element substrate 110 for preventing the impurity substance of the glass substrate from contaminating a semiconductor layer 113 formed on the second base film 112. The semiconductor layer 113 has an a-Si film formed through the CVD process, which then will be converted into a poly-Si film through laser irradiation.

A gate insulating film 114 as $SiO_2$ is formed to cover the semiconductor layer 113. A gate electrode 115 is formed opposite the semiconductor layer 113 so as to interpose the gate insulating film 114 therebetween. The impurity substance such as phosphorus and boron is ion implanted into the semiconductor layer 113 using the gate electrode 115 as the mask. Then the conductivity is applied to form a source region or a drain region on the semiconductor layer 113.

An inter-layer insulating film 116 is formed of $SiO_2$ to cover the gate electrode 115 so as to insulate the gate wiring formed on the layer on which the gate electrode 115 is formed from a drain wiring 117 formed on the inter-layer insulating film 116. The drain wiring 117 allows the drain of the semiconductor layer 113 to be connected to the inter-layer insulating film 116 and the gate insulating film 114 via through holes.

An inorganic passivation film 118 formed of SiN is applied to protect the TFT. An organic passivation film 119 is formed on the inorganic passivation film 118 to protect the TFT completely together with the inorganic passivation layer 118, and to further flatten the surface on which the organic EL layer 122 is formed. The organic passivation film 119 is formed to be thick in the range from 1 to 4 µm.

A reflection electrode 121 as Al or an Al alloy is formed on the organic passivation film 119. The reflection electrode 121 serves as the lower electrode 121 as shown in FIG. 5. The Al or the AL alloy is suitable for forming the reflection electrode 121 because of high reflectance. The reflection electrode 121 is connected to the drain wiring 117 via through holes formed in the organic passivation film 119 and the inorganic passivation film 118.

The embodiment is formed as the organic EL display device of top anode type, and accordingly, the lower electrode 121 of the organic EL layer 122 becomes the cathode. The Al or the Al alloy employed as the reflection electrode 121 may serve as the lower electrode 121 of the organic EL layer 122. As the work function of the Al or the Al alloy is relatively small, it may function as the cathode.

The organic EL layer 122 formed of plural layers is applied onto the lower electrode 121. In the case of the top anode type, an electron injection layer, an electron transport layer, an emission layer, a hole transport layer, and a hole injection layer are laminated from the lower side. The organic EL layer is formed by conducting the mask deposition. Generally, the electron injection layer, the electron transport layer and the like for the respective colors are deposited together. The emission layer and the hole transport layer for the respective colors are deposited separately.

An upper electrode 123 expected to serve as the cathode is formed on the organic EL layer 122 through deposition. An IZO (Indium Zinc Oxide) as the transparent electrode is employed as the upper electrode 123. The IZO is deposited over an entire display region, and has the thickness of approximately 30 nm for maintaining the light transmittance. Instead of the IZO, ITO (Indium Tin Oxide) as the metal oxide conductive film may be employed as the upper electrode.

A bank 120 is formed between adjacent pixels for preventing destruction of the organic EL layer 122 upon cutting at the end portion. The bank may be formed of an acrylic resin or a polyimide resin through the photolithography. The light emitted from the organic EL layer 122 is irradiated to the direction opposite the element substrate 110 as indicated by the direction L shown in FIG. 5 so as to form the image.

Figure 6:
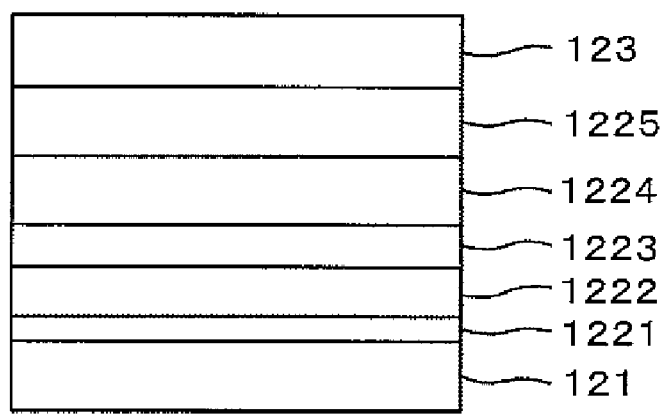
FIG. 6 shows an example of the organic El layer to be deposited by the present invention.

FIG. 6 is a sectional view schematically showing the organic EL layer 122. Referring to FIG. 6, an electron injection layer 1221 is formed on the lower electrode 121. The electron injection layer 1221 functions in facilitating injection of the electron from the cathode as the lower electrode 121. The electron injection layer 1221 is formed by co-deposition such that the molar ratio between the tris(8-quinolinol) aluminum (hereinafter referred to as Alq3) and Li establishes the relationship of $2<Li/Alq3<4$. The thickness of the electron injection layer 1221 is 3 nm.

An electron transport layer 1222 is formed on the electron injection layer 1221. The electron transport layer 1222 is formed by subjecting the Alq3 to the vacuum deposition to have the thickness of 20 nm. The layer functions in transporting the electron efficiently to an emission layer 1223 with as little resistance as possible. In the emission layer 1223 formed on the electron transport layer, the electron and the hole are recombined to have EL emission. The emission layer 1223 is formed into the co-deposited film of Alq3 and quinacridone (Qc) to have the thickness of 20 nm. The ratio of the deposition rate between the Alq3 and Qc is 40:1. A hole transport layer 1224 is formed on the emission layer 1223. The hole transport layer 1224 functions in transporting the hole supplied from the anode efficiently to the emission layer 1223 with as little resistance as possible. The hole transport layer 1224 is formed by subjecting the α-NPD to the deposition to have the thickness of 50 nm. A hole injection layer 1225 is formed on the hole transport layer 1224 for making the injection of the hole from the anode easier. The hole injection layer 1225 is formed by subjecting the copper phthalocyanine to the deposition to have the thickness of 50 nm. The upper electrode 123 as the anode is formed on the hole injection layer 1225.

A transparent metal oxide may be formed through an EB deposition process and the like to have the thickness of 15 nm as a buffer layer between the hole injection layer 1225 and the upper electrode 123. The buffer layer as the metal oxide may be formed of $V_2O_5$, $MoO_3$, $WO_3$ for preventing the organic EL layer 122 from being damaged upon sputtering of the anode-forming material.

Any material may be employed for forming the emission layer so long as the dopant with fluorescence or phosphorescence is added to the host material with the electron and hole transport capability so as to be formed as the emission layer by the co-deposition through recombination. For example, as the host, a complex, an anthracene derivative, a carbazole derivative such as tris(8-quinolinolate)aluminum, bis(8-quinolinolate)magnesium, bis(benzo{f}-8-quinolinolate) zinc, bis(2-methyl-8-quinolinolate)aluminum oxide, tris(8-quinolinolate)indium, tris(5-methyl-8-quinolinolate) aluminum, 8-quinolinolate lithium, tris(5-chloro-8-quinolinolate)gallium, bis(5-chloro-8-quinolinolate)calcium, 5,7-dichlor-8-quinolinolate aluminum, tris(5,7-dipromo-8-hydroxyquinolinolate)aluminum, poly[zinc(II)-bis(8-hydroxy-5-quinolinyl)methane] may be employed.

Any material for forming the dopant may be employed so long as it traps the electron and hole in the host to be recombined for emission, for example, a pyran derivative for the red light, a coumarin derivative for the green light, and anthracene derivative for the blue light. Alternatively, the material for emitting the phosphorescence such as an iridium complex and pyridinate derivative may also be employed.

The substrate having the TFT and the organic EL layer formed thereon will be referred to as an element substrate. The organic EL layer is altered by water content to deteriorate the emission efficiency. The element substrate is sealed by the sealing substrate for suppressing deterioration of the emission efficiency and prolonging the life of the organic EL display device. Specifically, the sealant is applied around the sealing substrate by the dispenser so as to be adhered to the element substrate. Generally, glass is used for forming the sealing substrate.

The element substrate is adhered to the sealing substrate under the nitrogen atmosphere at the negative pressure. For this, nitrogen is filled in the organic EL display device. The ultraviolet curable resin or the thermosetting resin may be used for forming the sealant for sealing the element substrate and the sealing substrate. The ultraviolet rays are irradiated only to the seal portion so as to prevent the organic EL layer from being destroyed.

First Embodiment

Figure 1:
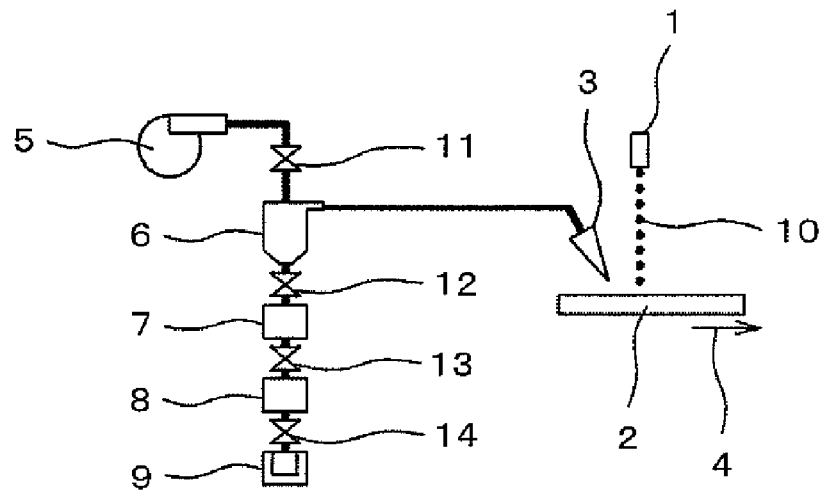
FIG. 1 is a view showing a basic structure of a device for cleaning the deposition mask of the organic EL element and collecting the deposition agent according to the present invention.

The present invention will be described referring to the drawings. FIG. 1 shows a basic structure of the present invention. A pulse laser 10 is irradiated from a laser irradiation window 1 to a deposition mask 2 as a target to be cleaned. The deposition mask 2 has been used for the deposition repeatedly, which needs to be cleaned. The frequency of the pulse laser is substantially long relative to the pulse width. The pulse laser is irradiated to the deposition mask 2 to be oscillated such that the deposition agent adhered to the deposition mask 2 is separated.

The deposition mask 2 moves along an advancing direction 4. The pulse laser 10 is controlled to scan vertically to the advancing direction 4. The advancement of the deposition mask 2 and the scan of the pulse laser 10 are combined so as to irradiate the pulse laser 10 to the entire surface of the deposition mask.

Figure 4:
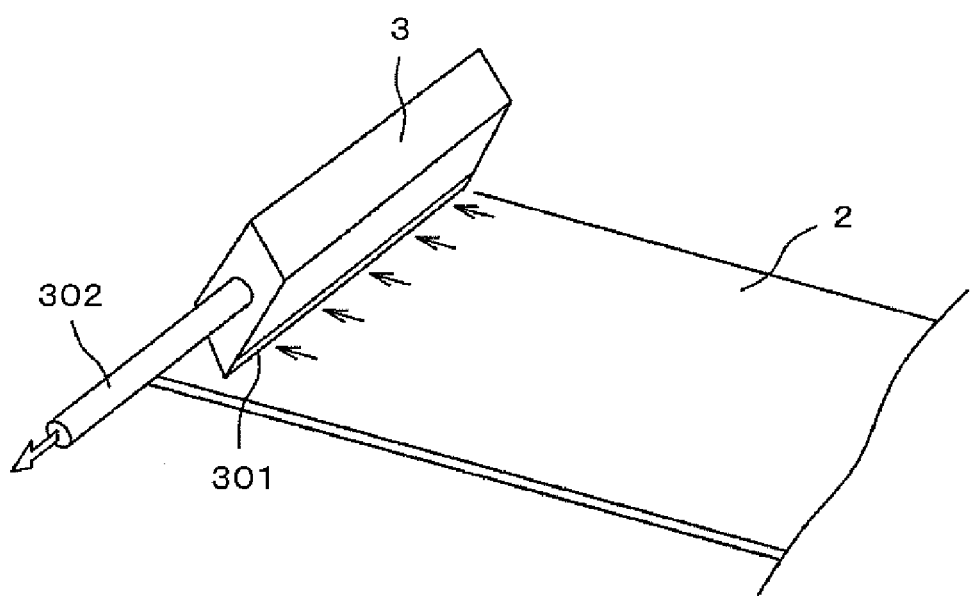
FIG. 4 is an example of a suction nozzle used in the present invention.

The deposition agent separated by the pulse laser is sucked by a suction nozzle 3 into a cyclone 6 together with the ambient air. The suction nozzle 3 includes a long suction hole 301 which covers the width of the deposition mask 2 as shown in FIG. 4, for example. The deposition agent is sucked through the suction hole 301. The deposition agent sucked by the suction nozzle 3 is further drawn into the cyclone shown in FIG. 1 from a suction duct 302.

The cyclone 6 is designed to trap particles each with the size equal to 4 μm or larger, for example. Each particle size of the respective deposition agent separated from the deposition mask 2 is in the range from 10 μm to 100 μm, and accordingly, most of the particles may be trapped by the cyclone 6. The light-weight ambient air is drawn to the upper section so as to be led to a blower 5. Meanwhile, the weighted deposition agent is deposited on the bottom of the cyclone 6.

At the end of the cleaning of the deposition mask 2, the blower 5 is stopped, a valve A11 is closed and a valve B12 is opened so as to drop the deposition agent to a deposition agent collection section 7. After dropping the deposition agent, the valve B12 is closed and the valve A11 is opened to activate the blower 5 to start the next cleaning of the deposition mask 2.

The aforementioned procedure is repeatedly executed and the valve C13 is opened to drop the deposition agent in the deposition agent collection section 7 into a deposition agent refining section 8 as a refining section for removing impurities such as a foreign substance. The deposition agent at the end of the processing in the deposition agent refining section 8 is dropped into a deposition agent storage section 9 by opening a valve D14. The deposition agent deposited on the deposition agent storage section 9 is transferred to a deposition chamber so as to be recycled as the new deposition agent.

Figure 2:
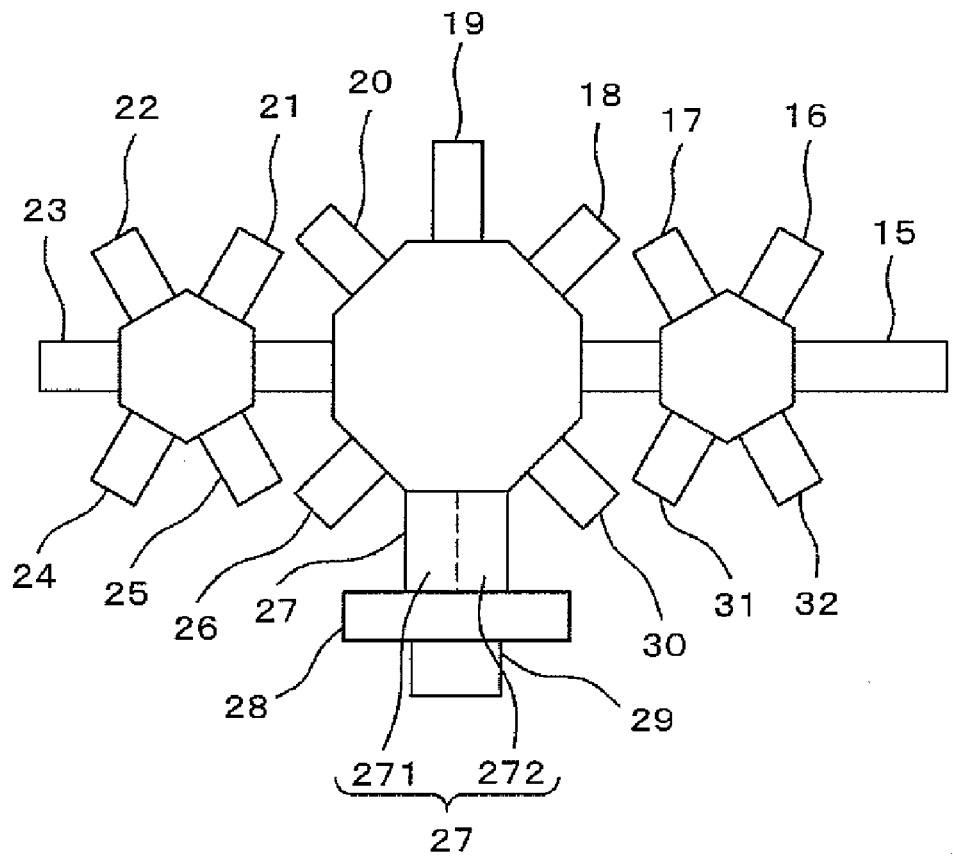
FIG. 2 is a view showing a system structure of the organic EL element manufacturing device.

FIG. 2 shows a structure of the organic EL manufacturing device with which the present invention is assembled. An example for manufacturing the organic EL display device of top emission/top anode type as described referring to FIG. 5 will be described referring to FIG. 2. However, the present invention is not limited to the aforementioned type, and applicable to any type including the top emission/top cathode type, and the bottom emission type.

The manufacturing device shown in FIG. 2 mainly includes stages A, B and C, and a deposition mask cleaning section connected to the stage B. Each stage is equipped with a robot arm designed to move and locate the element substrate, the sealing substrate or the deposition mask 2 to the predetermined position.

Referring to FIG. 2, the element substrate having formation of the lower electrode completed is supplied from the left side. The ultraviolet ray is irradiated to the element substrate in a first element substrate preprocessing section 23 such that the organic substance adhered to the element substrate is decomposed to be easily removed. Thereafter, the surface of the element substrate is cleaned in a second element substrate processing section 24.

The cleaned element substrate is transferred to an electron injection layer deposition section 24 for depositing the electron injection layer as described above. The electron injection layer is formed common to the respective colors. The resultant deposition mask 2 in the electron injection layer deposition section 24 becomes the one with a large opening rather than the one having the hole for each sub-pixel. The element substrate having the electron injection layer deposited is transferred to an electron transport layer deposition section 22 for depositing the electron transport layer. Since the electron transport layer is formed common to the respective colors, the resultant deposition mask 2 in the electron transport layer deposition section becomes the one with a large opening rather than the one with the hole for each sub-pixel.

The element substrate to which the electron transport layer has been applied is transferred to the organic EL layer deposition stage for the respective colors where red, green and blue emission layers are deposited. The order for the deposition is not necessarily specified. Referring to FIG. 2, the red emission organic EL is deposited in a red emission layer deposition section 21.

Then the element substrate is transferred to the stage B, and a green emission organic EL is deposited in a green emission layer deposition section 26. Thereafter, the element substrate is transferred to a blue emission layer deposition section 30 where the blue emission organic EL is deposited. Each material for the emission organic EL is applied on the deposition mask 2 for each sub pixel, and deposited via a hole with the sub pixel shape. The pixel is formed by combining the red, green and blue sub pixels. Each diameter of the respective holes is small, thus requiring accurate positioning. The organic EL material is deposited on the side wall of each hole for each deposition process, which makes the diameter of the hole of the deposition mask 2 small. It is therefore necessary to clean the deposition mask 2 periodically.

The element substrate is transferred to a hole transport layer deposition section 20 for depositing a hole transport layer using the deposition mask 2 having the hole formed for each of the sub pixels. After depositing the hole transport layer, the element substrate is further transferred to a hole injection layer deposition section 19 for depositing a hole injection layer using the deposition mask 2 having the hole formed for each of the sub pixels.

Thereafter, the element substrate is transferred to an anode deposition section 18 for depositing the IZO to become the anode, for example. The IZO is deposited over an entire display region of the organic EL display device without being deposited for each sub pixel. The element substrate thus formed is transferred to the stage C so as to be stored in a substrate storage section 31.

Referring to FIG. 2, the sealing substrate for protecting the organic EL layer formed on the element substrate from water is fed into a first sealing glass preprocessing section 15 at the right side. In the first sealing glass preprocessing section 15, the ultraviolet ray is irradiated to the sealing glass to decompose and remove the organic substance. Then the sealing substrate is transferred to a second sealing glass preprocessing section 16 for forming the sealing material by the dispenser and the like. In the second sealing glass preprocessing section 16, a desiccant is placed on the sealing substrate.

The sealing substrate to which the sealing material is applied is transferred to a joint sealing section 17 so as to be joined with the element substrate transferred from the substrate storage section. In the joint sealing section 17, the ultraviolet ray is irradiated to the portion of the sealing material to be cured such that the element substrate is adhered to the sealing substrate. The process in the joint sealing section 17 is performed in the nitrogen atmosphere at the reduced pressure. The organic EL display device having the element substrate joined with the sealing substrate is transferred to a finished product output section 32, and is further transferred to a post process.

In the aforementioned process, as the deposition mask 2 for the deposition is successively used with repetition, the organic EL material is deposited on the deposition mask 2, thus causing such phenomenon as reducing the diameter of the hole of the deposition mask 2, for example. As the organic EL material is expensive, it is preferable to recycle the organic EL material adhered to the deposition mask 2.

Referring to FIG. 2, a deposition mask storage section 27 in the stage B stores the deposition mask 2 used for the deposition many times. The deposition mask storage section 27 is divided into a pre-cleaning deposition mask storage section 271 and a post-cleaning deposition mask storage section 272. The deposition mask 2 used for about 200-hour deposition is transferred to the pre-cleaning deposition mask storage section from the red emission layer deposition section, the green emission layer deposition section, the blue emission layer deposition section and the like so as to be stored therein.

The deposited deposition mask 2 is transferred from the pre-cleaning deposition mask storage section 271 to a deposition mask cleaning section 28 for cleaning the deposition mask 2 by separating the organic EL material therefrom in the process as shown in FIG. 1. The deposition mask cleaning section 28 is divided into sections for the respective colors of the organic EL layer. The cleaned deposition mask 2 is transferred to the post-cleaning deposition mask storage section 272 so as to be used for the next deposition.

In the deposition mask cleaning section 28, the organic EL material separated from the deposition mask 2 moves to a deposition agent collection stage 29 through a duct. The deposition agent collection stage 29 is divided into the sections for the respective colors of the organic EL layer. The deposition agent collection stage 29 includes the deposition agent collection section 7, the deposition agent refining section 8, and the deposition agent storage section 9 as shown in FIG. 1 for collecting and refining the deposition agent, and storing the refined deposition agent in the deposition agent storage section so as to be used for a new deposition process.

The specific example using the aforementioned structure will be described. The cleaning of the deposition mask 2 subjected to approximately 200-hour deposition is performed with the basic device as shown in FIG. 1 using the deposition agent Alq3 (tris(8-quinolinolate) aluminum derivative). The valve A11 is opened to activate the blower 5 while keeping the valves B12, C13 and D14 closed.

The pulse laser 10 is irradiated to the deposition mask 2 from the laser irradiation window 1 while being transferred along the advancing direction 4. The pulse laser 10 is controlled to scan in the direction vertical to the advancing direction 4. The deposition agent separated from the deposition mask 2 by the pulse laser is sucked by the suction nozzle 3 to reach the cyclone 6.

At the end of the cleaning process of the deposition mask 2, the blower 5 is stopped and the valve A11 is closed. The processed deposition agent is deposited on the bottom of the cyclone 6. Then the valve B12 is opened to drop the deposition agent into the deposition agent collection section 7. The valve B12 is closed after dropping the deposition agent, and the valve C13 is opened. The deposition agent is dropped into the deposition agent refining section 8, and the valve C13 is closed. The impurities such as the foreign substance are removed from the deposition agent in the deposition agent refining section 8 so as to be collected in the deposition storage section 9 by opening the valve D14.

The collection rate is then calculated. When setting the weight of the deposition mask 2 obtained by subtracting the weight after the cleaning from the weight before cleaning to M, and setting the weight of the deposition agent collected in the deposition agent storage section 9 to R, the value of R/M results in 0.9. That is, 90% of the deposition agent is collected.

The cleaned deposition mask 2 is immersed in a chloroform solution to extract the residual deposition agent so as to obtain the cleaning efficiency. The change in the weight of the deposition mask 2 between the cases before and after the chloroform immersion was measured. The resultant difference is equal to $1/100$ of the weight difference M between the cases before and after the cleaning of the deposition mask 2 or smaller. That is, the deposition mask 2 is cleaned by 99% or greater.

Second Embodiment

Figure 3:
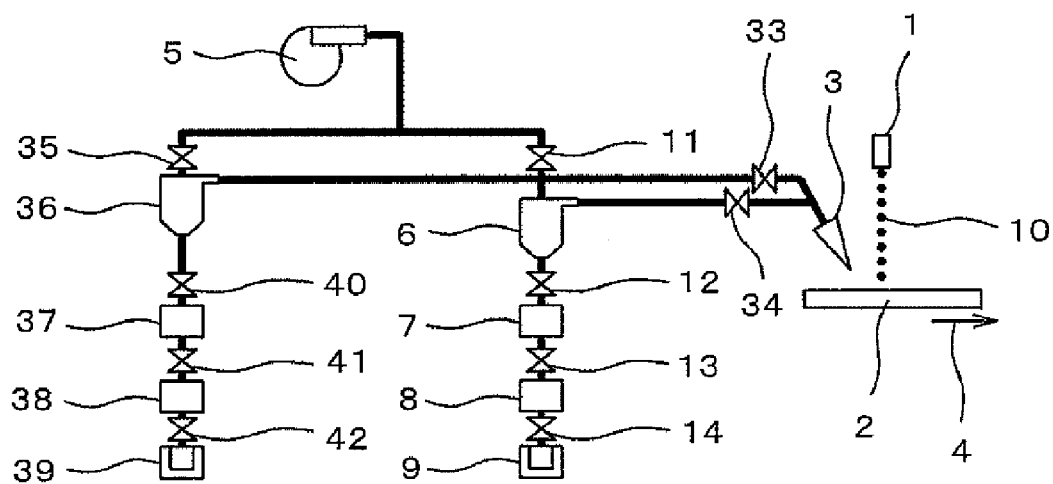
FIG. 3 is a view showing an application example of the device for cleaning the deposition mask of the organic EL element and collecting the deposition agent according to the present invention.

An example where two kinds of deposition masks 2, that is, the one subjected to 200-hour deposition using the deposition agent Alq3 (tris(8-quinolinolate)aluminum derivative), and the one subjected to 200-hour deposition using the deposition agent BeBq(bis(benzoquinolinolate)beryllium derivative) will be described hereinafter. FIG. 3 shows the structure of the device, which is formed by adding one more collection section to the basic structure shown in FIG. 1 to allow processing of two kinds of the deposition masks 2. The deposition mask 2 is cleaned using Alq3. The valves F34 and A11 are opened, and valves E33 and G35 are closed to activate the blower 5. The deposition mask 2 is transferred along the advancing direction 4 while irradiating the pulse laser 1. When the cleaning of the deposition mask 2 using Alq3 is finished, the valves F34 and A11 are closed, and the valves E33 and G35 are opened to process the deposition mask 2 using BeBq. The process for collecting the deposition agent is the same as in the first embodiment.

Each weight change of the respective processed deposition masks 2 between the cases before and after the cleaning is used for calculating the R/M. The value of the R/M for the deposition mask 2 using Alq3 results in 0.9, and the one for the deposition mask 2 using BeBq also results in 0.9. This means the collection by 90% is established in both cases.

The gas chromatography is used for analyzing to confirm if the deposition agent Alq3 collected first is mixed with the subsequently collected BeBq. The resultant value is less than the detection limit. That is, the deposition agents are not mixed in spite of the successive processing by switching the valve.

The present invention may be applied to the device using the deposition mask besides the device for manufacturing the organic EL element as described above.

What is claimed is:

1. A cleaning method of a deposition mask for cleaning the deposition mask to which a deposition agent is adhered, comprising the steps of:
    irradiating a pulse laser to the deposition mask to separate the deposition agent from the deposition mask;
    opening a first valve between a cyclone and a suction blower, and closing a second valve between the cyclone and a deposition agent collection section;
    sucking the deposition agent from the deposition mask by the suction blower and the cyclone via a suction nozzle disposed near the deposition mask to draw air to the suction blower in the cyclone and to deposit the deposition agent on a bottom of the cyclone; and
    closing the first valve and opening the second valve to collect the deposition agent into the deposition agent collection section.

2. The cleaning method of a deposition mask according to claim 1, wherein the deposition agent collection section is connected to a deposition agent refining section via a third valve to move a deposition agent collected in the deposition agent collection section to the deposition agent refining section by closing the second valve and opening the third valve.

* * * * *